United States Patent [19]

Schaper

[11] Patent Number: 4,577,214
[45] Date of Patent: Mar. 18, 1986

[54] LOW-INDUCTANCE POWER/GROUND DISTRIBUTION IN A PACKAGE FOR A SEMICONDUCTOR CHIP

[75] Inventor: Leonard W. Schaper, West Orange, N.J.

[73] Assignee: AT&T Bell Laboratories, Murray Hill, N.J.

[21] Appl. No.: 584,299

[22] Filed: Mar. 2, 1984

Related U.S. Application Data

[63] Continuation of Ser. No. 261,037, May 6, 1981, abandoned.

[51] Int. Cl.[4] .................. H01L 23/48; H01L 29/44; H01L 23/02
[52] U.S. Cl. ..................................... 357/74; 357/70; 357/80
[58] Field of Search ................. 357/51, 70, 74, 80, 357/81, 65, 68

[56] References Cited

U.S. PATENT DOCUMENTS

| 3,268,778 | 8/1966 | Worsham | 357/74 |
| 3,535,486 | 10/1970 | Wood | 357/74 |
| 3,554,821 | 1/1971 | Caulton et al. | 357/74 |
| 3,713,006 | 1/1973 | Litty et al. | 357/74 |
| 3,728,589 | 4/1973 | Caulton | 357/74 |
| 3,932,932 | 1/1976 | Goodman | 29/625 |
| 3,969,752 | 7/1976 | Martin et al. | 357/80 |
| 3,999,142 | 12/1976 | Presser | 357/80 |
| 4,249,196 | 2/1981 | Durney et al. | 357/74 |
| 4,340,902 | 7/1982 | Honda et al. | 357/74 |

FOREIGN PATENT DOCUMENTS

| 2456951 | 6/1975 | Fed. Rep. of Germany | 357/70 |
| 0032267 | 3/1977 | Japan | 357/68 |

Primary Examiner—James W. Davie
Assistant Examiner—Vangelis Economou
Attorney, Agent, or Firm—Lucian C. Canepa

[57] ABSTRACT

A package for a semiconductor chip includes as an integral part thereof a frame-shaped multilayer ceramic capacitor. The chip is mounted within the capacitor structure. Conductive portions of the capacitor serve as the terminals and plates of the capacitor and as planar power and ground members for interconnecting an external power supply to the chip. By means of these planar members, power is distributed to the chip in a low-impedance, substantially transient-free manner without utilizing any of the multiple signal leads emanating from the package. Moreover, the signal leads are separated from the ground plane by a low-dielectric-constant material. As a result, the signal leads are minimally loaded and are characterized by a relatively constant impedance selected to optimize signal transfer to and from the chip.

4 Claims, 7 Drawing Figures

LOW-INDUCTANCE POWER/GROUND DISTRIBUTION IN A PACKAGE FOR A SEMICONDUCTOR CHIP

This application is a continuation of application Ser. No. 261,037, filed May 6, 1981, now abandoned.

BACKGROUND OF THE INVENTION

This invention relates to semiconductor chips and, more particularly, to a package structure for housing and establishing electrical connections to such a chip.

Various designs for packaging semiconductor chips are known. Some of these designs provide adequate mechanical, environmental and thermal protection for the housed chip. But, with respect to establishing signal and power connections to the chip, these package designs typically treat signal interconnection and power distribution to the chip as being basically the same. As a result of this standard design approach, conventional packages suffer from the disadvantage that the power supplied to the chip may include undesirable switching transients. This is particularly true if relatively large currents must be switched and delivered to the chip in a high-speed manner. In such cases, the presence of even small inductances in the power supply distribution network, even within the chip package, can generate significant spurious voltage signals. Such signals can, of course, deleteriously affect the performance of the chip.

To minimize the impedance, especially the inductance, of the distribution network that supplies power to the chip, it is standard practice in a conventional high-performance package design to utilize multiple ones of the package leads as power and ground connections. This approach tends to reduce inductance and thereby reduce the magnitude of spurious or transient signals that occur in the power distribution network. But one penalty of this approach is that a relatively large number of pins or leads of the package are thereby made unavailable for signal transfer purposes. In some cases, this may in turn necessitate redesign of the package to provide a physically larger unit with additional signal leads. Such a redesign, however, clearly runs counter to the desired goal of making the packaged chips as small as possible.

Additionally, a separate by-pass capacitor element is often utilized in the distribution network that supplies power to an integrated circuit chip. Spurious noise signals arising from switching transients are shunted by the by-pass capacitor element and thereby kept from being applied to the chip. Moreover, the capacitor acts as a local reservoir of energy for current surges drawn by the chip. But, even if such a capacitor element is positioned physically close to its associated chip on a mounting board, inductance in the leads connecting the element to the chip can be the basis for generating significant spurious voltages in the connecting leads. These voltages are "seen" only at the chip itself. Moreover, the by-pass capacitors included in a microelectronic assembly can occupy a significant part of the available area on the mounting board. As the trend to smaller and smaller assemblies continues, it would obviously be desirable to reduce the board area occupied by by-pass capacitors.

Accordingly, considerable effort has been directed by trying to design improved packages for semiconductor chips. In particular, much effort has been directed at trying to provide small-size packaged chips exhibiting high-performance electrical characteristics.

SUMMARY OF THE INVENTION

Hence, an object of the present invention is an improved package for a semiconductor chip. More specifically, an object of this invention is a packaged chip to which power is supplied in a substantially transient-free manner and to and from which signals are transferred in a particularly effective way. Moreover, another object of the invention is to provide a power supply by-pass capacitor for the chip in as compact and space-saving a manner as possible.

Briefly, these and other objects of the present invention are realized in a specific illustrative embodiment thereof in which a package for a semiconductor chip includes planar power and ground members. Additionally, the package includes multiple signal leads extending therefrom. By means of the planar members, power is distributed to the chip from an external power supply. Significantly, this is done in a low-impedance substantially transient-free manner.

To minimize inductance, both of the planar power and ground members are designed to be as large in area as possible. Moreover, the planar members are formed in the package in closely spaced-apart parallel planes. Electrical connections extend from the planar members to a common interconnection level of the package.

Advantageously, the signal leads are separated from the ground plane of the package by a low-dielectric-constant material. As a result, the signal leads are minimally loaded and are characterized by a relatively constant impedance selected to optimize signal transfer to and from the chip.

Moreover, in one particular illustrative embodiment of the principles of the present invention, a power supply by-pass capacitor element is advantageously included in the chip package as an integral part thereof.

More specifically, one particular illustrative version of a packaged semiconductor chip made in accordance with the principles of the present invention comprises a frame-shaped capacitor element that constitutes an integral part of the package. The chip is mounted within a recess defined by the frame-shaped element. Conductive surface portions formed on the capacitor element serve as terminals of the element and as planar power and ground members for interconnecting an external power supply to the chip. Power supply terminal members connected to the planar members emanate from the package. Link members connect the power and ground members to the chip. Additionally, an insulating layer is formed on the planar ground member. Multiple signal leads extend from the package. These leads lie on the insulating layer and are connected to the chip.

BRIEF DESCRIPTION OF THE DRAWINGS

A complete understanding of the present invention and of the above and other features thereof may be gained from a consideration of the following detailed description presented hereinbelow in connection with the accompanying drawings, in which.

DETAILED DESCRIPTION

Figure 1:
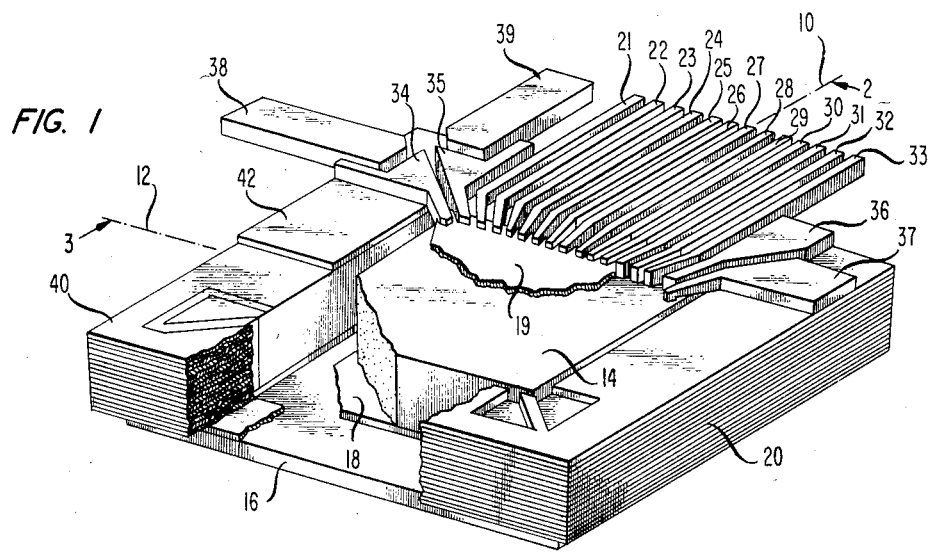
FIG. 1 is a perspective view, partially broken away, of a specific illustrative semiconductor chip package made in accordance with the principles of the present invention.

In FIG. 1, a conventional semiconductor chip 14 is shown mounted on a conductive plate 16 that constitutes the base member of a package for the chip. The plate 16, made, for example, of aluminum, serves as a heat sink for the depicted assembly. By way of example, the chip comprises a standard high-speed very-large-scale-integrated circuit of the metal-oxide-semiconductor type. Illustratively, the bottom side of the chip 14 is bonded to the plate 16 by a layer 18 of conductive epoxy cement.

A frame-shaped element 20 surrounds the chip 14 of FIG. 1. The element 20 is also bonded to the plate 16 by means of the conductive epoxy cement layer 18. In one specific illustrative embodiment of the invention, the frame-shaped element 20, which serves as an integral part of the depicted package, comprises a by-pass capacitor.

In other embodiments of the principles of the present invention, the frame-shaped element 20 is not a capacitor but designed instead simply to be a part of the housing for the chip 14. The main emphasis herein will be directed to an embodiment in which the element 20 is a capacitor. In such an embodiment, which constitutes a particularly compact and advantageous version of applicant's invention, the closely spaced-apart plates of the capacitor itself constitute the parallel-plane-disposed power and ground members of applicant's low-inductance power distribution network.

The capacitor element 20 of FIG. 1 is formed, for example, by punching a conventional multi-layer sheet of metallized layers of ceramic. Such multilayered ceramic sheets are known in the art and commercially available. Further details of the structure of the element 20 will be set forth below in connection with the description of FIG. 3.

Advantageously, multiple connections to the chip 14 are made thereto in a standard tape-automated-bonding operation before the chip is positioned within the package shown in FIG. 1. In that operation, multiple pads on the top of the chip are simultaneously connected to a conductive foil lead-frame, in a manner well known in the art. The lead-frame-supported chip 14 is then mounted in the depicted package. Subsequently, the lead-frame is trimmed. Additionally, a layer 19 of protective material, such as a standard room-temperature-vulcanizing rubber, is advantageously applied to the top surface of the chip 14, as indicated in FIG. 1.

A portion of the trimmed lead-frame is shown in FIG. 1. The depicted portion comprises signal leads 21 through 33 whose free or outer ends extend beyond one outer edge of the package. The other or inner ends of these leads are respectively electrically connected to various points of the integrated circuit formed on the chip 14. Additonally, the depicted portion comprises link members 34 through 37. The inner ends of the members 34 through 37 are respectively connected to various power and ground pads on the chip 14. Outer regions of these link members are connected to planar power and ground members formed on surfaces of the capacitor element 20, as will be specified in detail later below.

Furthermore, in accordance with the principles of the present invention, the trimmed lead-frame shown in FIG. 1 also includes power and ground terminal members 38 and 39. The inner ends of these members are respectively connected to the planar power and ground members formed on and within the capacitor element 20. The outer or free ends of the members 38 and 39 extend beyond outer edges of the package. These outer ends constitute terminal members for connecting the packaged chip to an external power supply.

In FIG. 1, only one group of thirteen signal leads 21 through 33 extending beyond one edge of the package are explicitly shown. But it is to be understood that such a package typically includes three other identical groups of signal leads respectively extending beyond the other three edges of the package. Additionally, the package also typically includes two other pairs of link members respectively disposed adjacent to the other two inner corners of the capacitor element 20. (These other signal leads and link members will be specifically identified below in connection with the description of FIG. 7.)

The upper conductive plate 40 of the capacitor element 20 shown in FIG. 1 constitutes a planar ground member. As insulating layer 42 made, for example, of a polyimide material is deposited on top of the ground member 40. In turn, all of the signal leads (such as the leads 21 through 33) include portions that rest directly on top of the insulating layer 42. In one specific illustrative embodiment, in which the width of each signal lead is about 100 micrometers, the thickness of each signal lead is 50-to-100 micrometers and the thickness of the layer 42 is 50-to-100 micrometers, the characteristic impedance of the signal leads is thereby established at about 50-to-80 ohms.

Figure 2:
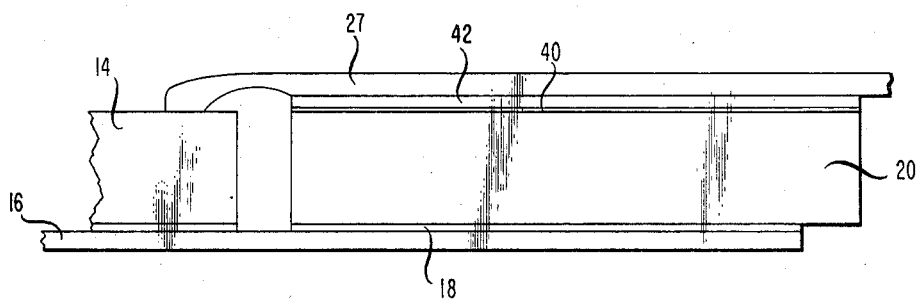
FIG. 2 is a cross-sectional depiction at line 10 of FIG. 1 as viewed in the direction of arrow 2.

FIG. 2 shows the conductive signal lead 27 of the packaged chip of FIG. 1. The lead 27 is disposed on the insulating layer 42 that overlies the planar ground member 40. As indicated above, the member 40 is the top conductive plate of the capacitor element 20. Portions of the chip 14, the conductive bonding layer 18 and the base plate 16 are also indicated in FIG. 2. If desired, a thin nonconductive bonding layer (not shown) may be interposed between the lead 27 and the insulating layer 42 to impart additional mechanical stability to the assembly. Alternatively, the dielectric layer 42 may itself be an adhesive material.

Figure 3:
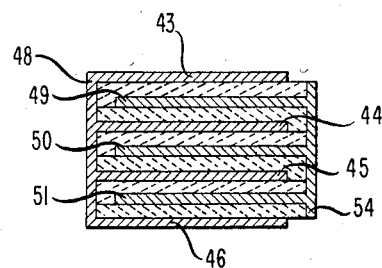
FIG. 3 is a cross-sectional representation at line 12 of FIG. 1 as viewed in the direction of arrow 3.

FIG. 3, which is a cross-sectional representation of the capacitor element 20, indicates the multilayered structure thereof. The element 20 comprises alternating layers of metal and ceramic. Metallic layers 43 through 46 are interconnected by side metallization 48. Top metallic layer 43 constitutes the ground plane 40 shown in FIG. 1. Accordingly, in this particular illustrative embodiment, the bottom metallic layer 46 that rests in contact with the base plate 16 (FIG. 1) is also intended to be grounded.

By means of power supply terminal member 38 (FIG. 1), the ground (or relatively negative) terminal of an external direct-current power supply is connected to the layers 43 through 46 and to the side metallization 48 shown in FIG. 3. The particular manner in which this is done within the package assembly will be specified in more detail below.

Metallic layers 49 through 51 shown in FIG. 3 are interconnected by side metallization 54. The side portion 54 is intended to be connected to the positive terminal of an external direct-current power supply. This is done by establishing an electrical connection within the package assembly between the metallization 54 and power supply terminal member 39, as will be specified in more detail below.

Figure 4:
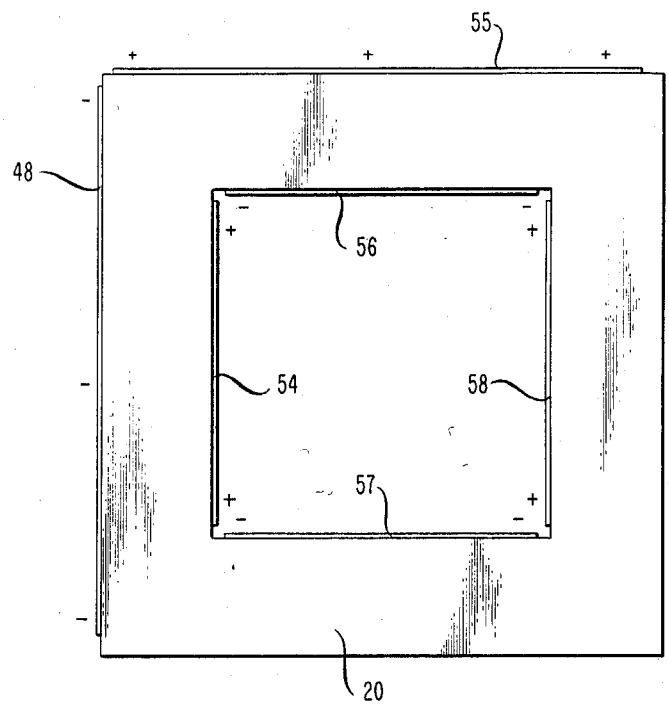
FIG. 4, which is a top view of the capacitor element included in FIG. 1, depicts side-metallized portions thereof.

FIG. 3 shows two of the side metallizations formed on the capacitor element 20. These metallizations 48 and 54 are schematically represented in FIG. 4 and identified there with the same reference numerals utilized therefor in FIG. 3. Moreover, in FIG. 4, these metallizations 48 and 54 are designated with negative and positive signs to indicate to which respective terminals of the external power supply they are intended to be connected. Furthermore, in accordance with the principles of the present invention, additional similar side metallizations are formed on the element 20. These additional metallizations 55 through 58 are shown in FIG. 4 and are also marked with positive and negative signs to indicate their interconnection pattern.

It is evident from FIG. 4 that energy from an external power supply enters the capacitor element 20 at the outside edges of the element. Connections for the power supply are made to those edges by means of the terminal members 38 and 39 (FIG. 1). In turn, energy is delivered from the capacitor element to the associated chip along the inner edges of the element via short connections to the chip contained therein. In that way, the inductances included in the input and output circuit paths connected to the capacitor element 20 are minimized.

Figure 5:
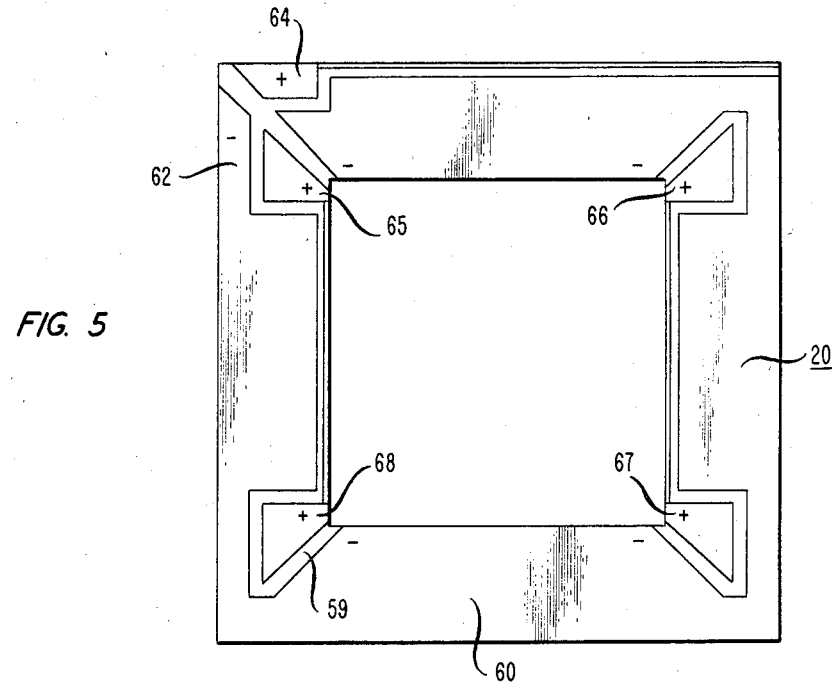
FIG. 5 is a top view of the metallic pattern formed on top of the capacitor element.

FIG. 5 shows the metallization pattern printed or otherwise formed in a standard manner on the capacitor element 20 on top of the uppermost ceramic layer 59 thereof. A major part 60 of the pattern comprises the aforespecified ground plane (designated with a negative sign). The part 60 is electrically connected to the side metallizations 48, 56 and 57 represented in FIG. 4. Illustratively, the power supply terminal member 38 (FIG. 1) is designed to contact end portion 62 of the part 60.

Also formed on top of the uppermost ceramic layer 59 (FIG. 5) of the capacitor element 20 are conductive regions 64 through 68 (each marked with a positive sign). The region 64 is electrically connected to the side metallization 55 of FIG. 4; the regions 65 and 68 are connected to the side metallization 54 of FIG. 4; and the regions 66 and 67 are connected to the side metallization 58 of FIG. 4.

The power supply terminal member 39 (FIG. 1) is designed to contact the conductive region 64 of FIG. 5. In that way, the positive side of the external power supply is connected to the capacitor element 20.

As indicated in FIG. 5, each of the four inner corners of the metallization pattern formed on top of the capacitor element 20 includes positive and negative regions. By means of link members, interconnections are made between these regions and conductive pads on the chip contained within the depicted framework. Four such link members designated 34 through 37 are shown in FIG. 1.

In the aforespecified illustrative embodiment, the link member pairs are shown at the corners of the chip. But it is to be understood that these link members may be located anywhere around the periphery of the inside edge of the capacitor element 20 if appropriate electrical connections to the positive (power) metallization are made by conductive patterns and/or conductive vias through the uppermost ceramic layer of the capacitor element.

Figure 6:
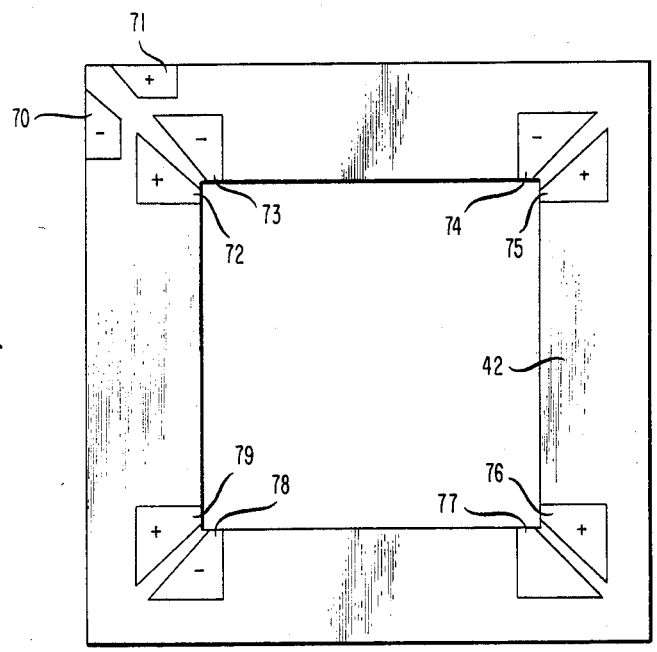
FIG. 6 is a top view of an insulating layer formed on top of the metallic pattern of FIG. 5.

FIG. 6 shows the pattern of the insulating layer 42 formed on top of the planar ground member 40 of FIG. 1. Openings 70 through 79 in the layer 42 provide access therethrough to selected portions of the underlying metallization pattern shown in FIG. 5. By means of conductive epoxy cement or by any other standard conductive attachment technique, electrical connections are established between the overlying lead-frame (FIG. 1) and the metallization portions directly underlying the openings 70 through 79.

Figure 7:
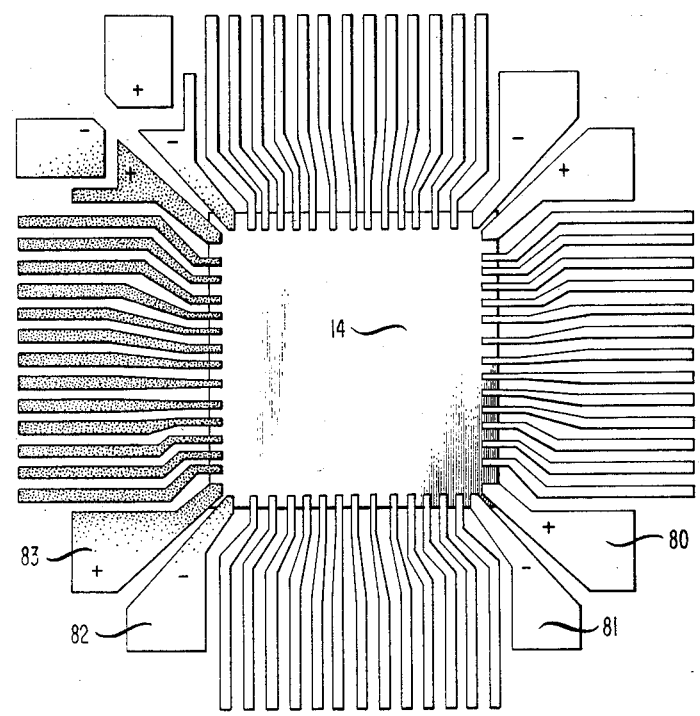
FIG. 7 is a top view of the lead-frame and chip shown in FIG. 1.

FIG. 7 is a top view of the particular illustrative packaged chip of FIG. 1. All fifty-two signal leads connected to the chip 14 are explicitly shown in FIG. 7. Moreover, the previously specified power supply terminal members 38 and 39 and the link members 34 through 37 associated with two corners of the chip 14 are also shown in FIG. 7. Further, four additional link members 80 through 83 associated with the other two corners of the chip 14 are also depicted in FIG. 7. By means of these eight link members, power is distributed from the inner corners of the aforedescribed capacitor element 20 to the four corners of the chip 14. And, by means of the depicted signal leads and the power supply terminal members 38 and 39, the packaged chip can be physically secured and electrically connected to a standard mounting board, in a manner well known in the art.

Finally, it is to be understood that the above-described structure is only illustrative of the principles of the present invention. In accordance with these principles, numerous modifications and alternatives may be devised by those skilled in the art without departing from the spirit and scope of the invention. For example, although primary emphasis herein has been directed to a package that includes as an integral part thereof a frame-like capacitor element, it is to be understood, as stated earlier above, that in some embodiments of this invention the frame-like member is not fabricated to be a capacitor but designed instead simply to be a part of the housing for the associated chip. In those embodiments also, planar power and ground members, suitably insulated from each other, are formed on and within portions of the frame-like member so as to minimize power-ground loop inductance. In such an embodiment, the ground member could be a top planar portion such as the member 40 of FIG. 1, and the power member could be another planar portion within the frame 20 below the member 40. Suitable electrical connections from the power member to the lead-frame level of the package are made by vias and/or surface conductive patterns, in a standard manner known in the art.

Furthermore, in those cases in which the frame-shaped element 20 is not a capacitor, the planar power and ground members may be formed in some other element of the package. For example, the base plate member 16 of FIG. 1 may be made of an insulating material having conductive power and ground members formed therein in closely spaced-apart parallel planes. Electrical connections would extend from those members to the lead-frame level of the package.

What is claimed is:

1. In combination, a semiconductor chip including conductive pads on one main surface thereof, said pads including multiple power pads and multiple ground pads, a package for said chip comprising a body member defining an interior cavity, means for mounting said chip within the interior cavity defined by said body member, closely spaced-apart planar ground and power members formed in parallel planes in said package said members substantially surrounding said cavity and extending around said chip, and, said members each having outer peripheral portions and inner peripheral portions, said inner portions in close proximity to said chip, only a single pair of power supply terminal members emanating from said package, said pair of terminal members consisting of a single power terminal member and a single ground terminal member, said single power terminal member being connected within said package to an outer peripheral portion of said planar power member and said single ground terminal member being connected within said package to an outer peripheral portion of said planar ground member, said single pair of power supply terminal members being adapted to be connected to the respective terminals of an external power supply, multiple link members within said package respectively connecting inner peripheral portions of said planar power member to said power pads on said chip, and multiple link members within said package respectively connecting inner peripheral portions of said planar ground member to said ground pads on said chip.

2. A combination as in claim 1 wherein each of said link members comprises a conductive-foil member.

3. A combination as in claim 1 wherein said body member comprises a capacitor element and said planar ground and power members constitute the terminals and plates of said element.

4. A combination as in claim 3 wherein said element comprises a frame-shaped multi-layer metallized ceramic capacitor.

* * * * *